(12) United States Patent
Hitomi et al.

(10) Patent No.: US 7,750,296 B2
(45) Date of Patent: Jul. 6, 2010

(54) SCANNING ELECTRON MICROSCOPE AND CALIBRATION OF IMAGE DISTORTION

(75) Inventors: Keiichiro Hitomi, Kokubunji (JP); Yasunari Sohda, Kawasaki (JP); Yoshinori Nakayama, Sayama (JP); Hajime Koyanagi, Koshigaya (JP)

(73) Assignee: Hitachi High-Technologies Corporation, Tokyo (JP)

( * ) Notice: Subject to any disclaimer, the term of this patent is extended or adjusted under 35 U.S.C. 154(b) by 250 days.

(21) Appl. No.: 11/866,426

(22) Filed: Oct. 3, 2007

(65) Prior Publication Data

US 2008/0210867 A1 Sep. 4, 2008

(30) Foreign Application Priority Data

Oct. 6, 2006 (JP) ............................. 2006-274607

(51) Int. Cl.
*G01J 4/00* (2006.01)
*G01N 23/00* (2006.01)

(52) U.S. Cl. ................. 250/310; 250/306; 250/307; 250/309; 250/311

(58) Field of Classification Search ............... 250/310, 250/306, 307, 309, 311
See application file for complete search history.

(56) References Cited

U.S. PATENT DOCUMENTS 6,107,637 A * 8/2000 Watanabe et al. ........ 250/559.3
6,333,510 B1 * 12/2001 Watanabe et al. ....... 250/559.27
6,441,384 B1 * 8/2002 Kojima ................. 250/492.23
6,465,781 B1 * 10/2002 Nishimura et al. .......... 250/306
6,753,518 B2 * 6/2004 Watanabe et al. ........ 250/201.3
6,919,577 B2 * 7/2005 Watanabe et al. ........ 250/559.4
7,027,143 B1 * 4/2006 Stokowski et al. ....... 356/237.2
7,064,339 B2 * 6/2006 Nishimura et al. ....... 250/492.1
7,329,889 B2 * 2/2008 Watanabe et al. ........ 250/559.3

FOREIGN PATENT DOCUMENTS

JP 2000-048755 2/2000

* cited by examiner

*Primary Examiner*—David A Vanore
(74) *Attorney, Agent, or Firm*—Antonelli, Terry, Stout & Kraus, LLP.

(57) ABSTRACT

In method and apparatus for obtaining a scanning electron microscope image devoid of distortion by measuring a scanning distortion and calibrating the scanning distortion, there occurs a problem that an error takes place in dimension control owing to a scanning distortion of an electron beam. To cope with this problem, an image is obtained by scanning a predetermined region with the electron beam, a plurality of regions are selected from the image, the pattern pitch is measured in each of the regions and a scanning distortion amount is calculated from the result of measurement and then corrected.

9 Claims, 15 Drawing Sheets

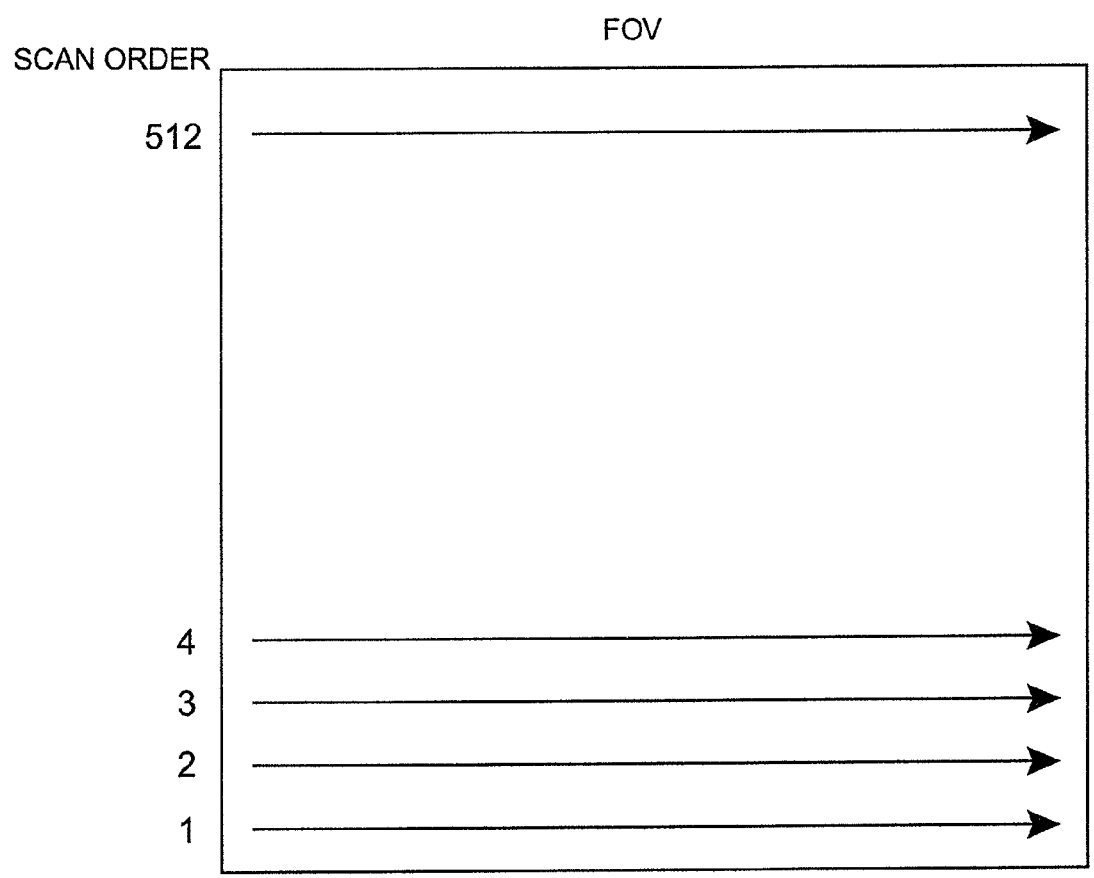

SCANNING ELECTRON MICROSCOPE AND CALIBRATION OF IMAGE DISTORTION

INCORPORATION BY REFERENCE

The present application claims priority from Japanese application JP2006-274607 filed on Oct. 6, 2006, the content of which is hereby incorporated by reference into this application.

BACKGROUND OF THE INVENTION

The present invention relates to a scanning electron microscope and calibration of a scanning electron microscope image distortion.

Miniaturization of semiconductor devices has recently been advancing more and more and geometrical dimensions need to be controlled more highly precisely. Under the circumstances, the dimension control using a scanning electron microscope is prevailing on the spot of semiconductor production. In the scanning electron microscope, however, a distortion called a scanning distortion takes place at the time that an electron beam is scanned using an electromagnetic deflector. Originally, a deflection magnetic field generated by the deflector of scanning electron microscope is uniform near the center but is not uniform at the edges, thus being the principal cause of a scanning distortion. Because of the non-linearity of the scanning signal, the dimension control by the scanning electron microscope is accompanied by errors. Then, JP-A-2000-48755 proposes method and apparatus for calibrating errors attributable to the scanning distortion. Specifically, the same site on the same specimen is observed at plural positions within the field of view of an electron microscope to measure the size. Results of sizes measured at the plural positions within the electron microscope view field are compared with one another and from the error in measurement result, the scanning distortion in the scanning electron microscope is measured.

SUMMARY OF THE INVENTION

In the JP-A-2000-48755, however, the same site on the same specimen needs to be measured plural times and so in the course of acquisition of scanning electron microscope images by plural times, the dimension changes owing to contamination and an electrification phenomenon and the influence of this change cannot be neglected. In addition, it is conceivable that when a measurement target object is moved to a different location within the scanning electron microscope image, a new distortion under the influence of accuracy and deflection of the stage movement will be generated, making it difficult to achieve accurate scanning distortion measurement.

To solve the above problems, a scanning electron microscope image is first acquired and then, a plurality of arbitrary regions are selected from the scanning electron microscope image and the pattern pitch in each of the regions is measured, thus calculating a scanning distortion amount from a result of the measurement. By reflecting the result of measurement of scanning distortion amount upon a deflector of the scanning electron microscope to control the deflector, a scanning electron microscope image devoid of scanning distortion can be provided. Alternatively, the scanning distortion measurement result is reflected on the magnification during measurement of dimension of the scanning electron microscope image and then the dimension value is measured.

Since the scanning electron microscope image is divided into a plurality of arbitrary regions and the scanning distortion amount can be calculated from the measurement results in the plural arbitrary regions, an accurate scanning distortion amount less affected by the dimension change attributable to the contamination and electrification phenomenon can be calculated.

Other objects, features and advantages of the invention will become apparent from the following description of the embodiments of the invention taken in conjunction with the accompanying drawings.

BRIEF DESCRIPTION OF THE DRAWINGS

FIG. 8 is a conceptual diagram for explaining the order of scan of scanning lines in the scanning electron microscope.

DETAILED DESCRIPTION OF THE EMBODIMENTS

Embodiment 1

The present invention will now be described by way of example with reference to the accompanying drawings.

Figure 1:
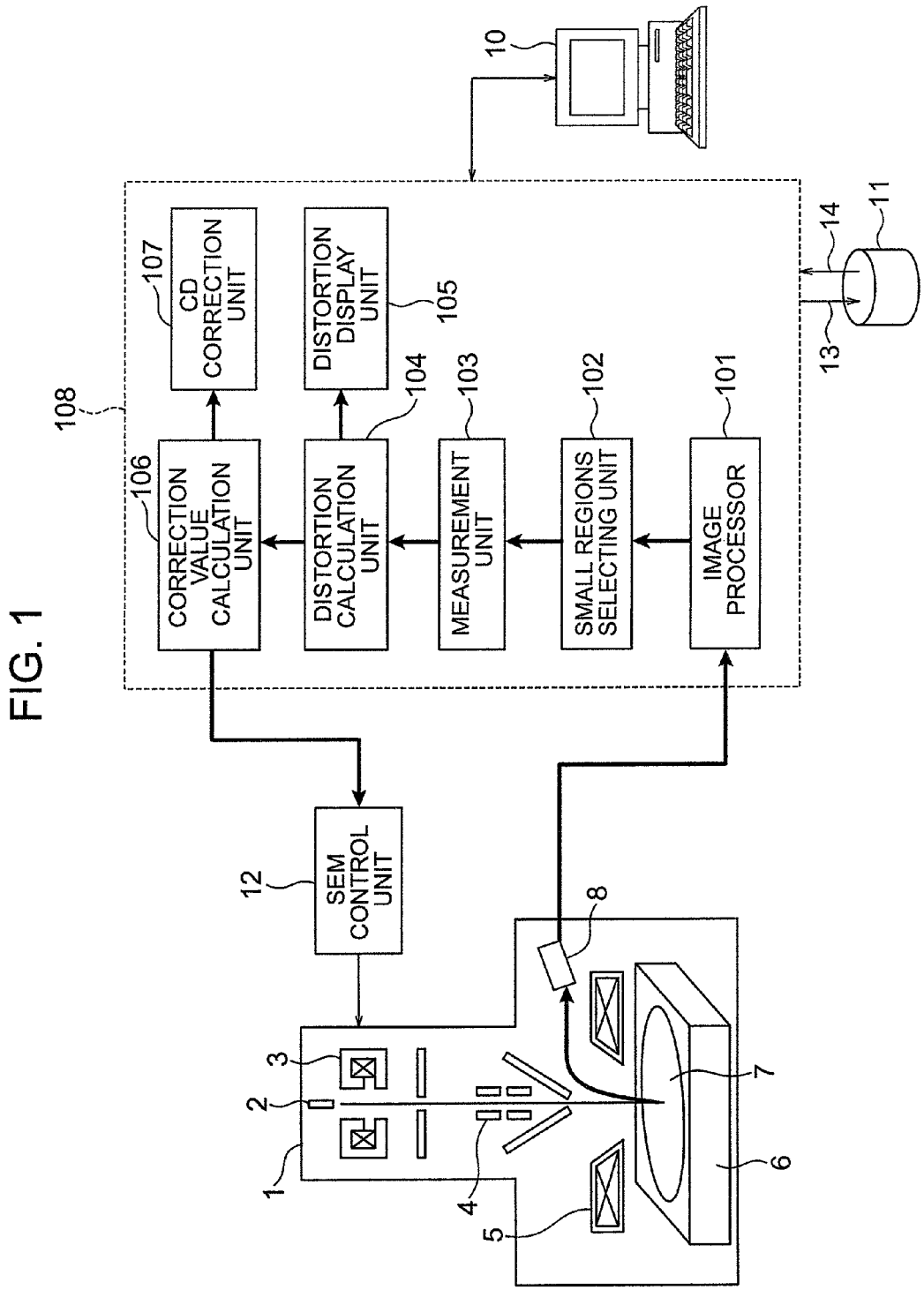
FIG. 1 is a diagram schematically illustrating a scanning electron microscope according to an embodiment of the present invention.

A scanning electron microscope according to the present embodiment has a system construction as schematically illustrated in FIG. 1. Principally, the scanning electron microscope system in the present embodiment comprises an electron optics 1, a detector 8 for detecting secondary electrons or backscattering electrons given off from a specimen, an information processor 108 for creating an image on the basis of information of the secondary electrons or backscattering electrons obtained from the detector 8 and performing various operations, a storage medium 11 for saving operation results, a display device 10 for displaying images and a SEM control unit 12 for controlling the electron optics. Principally, the electron optics 1 includes an electron beam gun 2 for generating an electron beam, a condenser lens 3 for converging the electron beam, a deflector 4 for scanning the electron beam on a specimen, and an objective lens 5 for just focusing the electron beam on the specimen.

Figure 2:
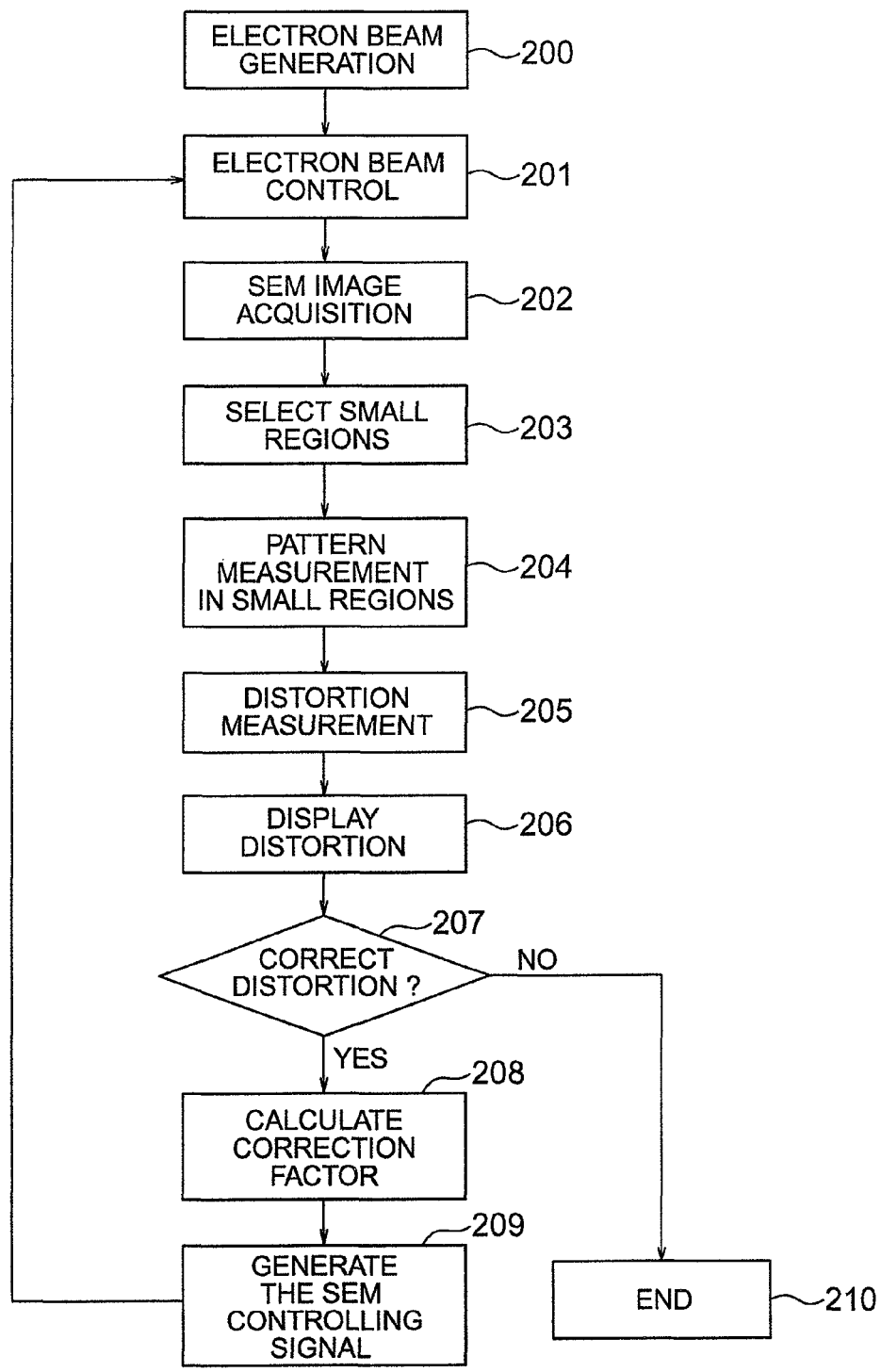
FIG. 2 is an exemplified flowchart of the procedure for distortion calibration.

Referring now to FIG. 2, a flow for scanning distortion correction in the present embodiment will be described. In the flow as shown in FIG. 2, a deflection signal for suppressing the scanning distortion in the scanning electron microscope is reflected on the deflector 4 to acquire a scanning electron microscope image of less scanning distortion.

In the present embodiment, an electron beam is first generated from the electron beam gun 2. Subsequently, the electron beam is scanned on the specimen by using a signal controlled by means of the SEM control unit 12 and secondary electrons thus generated are detected by means of the detector 8. On the basis of a secondary electron signal detected by the detector 8, an image processor 101 generates a scanning electron microscope image. Then, a plurality of arbitrary small regions in the scanning electron microscope image are selected and a small regions selecting unit 102 forms the individual regions. For the plurality of arbitrary small regions, small regions saved in advance in the storage medium 11 may be used or alternatively, the operator may arbitrarily select or designate regions on the basis of a secondary electron image displayed on the display device 10 through the medium of an input means such as keyboard or mouse. The dimension or size of a pattern or the pitch between adjacent patterns in each of the plural arbitrary small regions is measured by means of a measurement unit 103 and the calculation of a scanning distortion is carried out in a distortion calculation unit 104. Subsequently, a calculated scanning distortion is displayed on the display device 10 and it is decided whether scanning distortion correction is to be executed. A decision as to whether the correction is to be executed may be made by the operator on the basis of a result of display or alternatively, a threshold value may be set in the operation appliance and the correction may be executed when the threshold value is exceeded in respect of the individual small regions. If the scanning distortion correction is determined to be unnecessary, the scanning distortion correction ends in this phase. If the scanning distortion correction is determined to be necessary, an amount of scanning distortion correction is calculated in a correction value calculation unit 106 included in the operation appliance 108 and an electron optics signal is so controlled by the SEM control unit 12 as to comply with the correction amount.

The step of selecting plural arbitrary small regions from a secondary electron image by means of the small regions selecting unit 102 and the step of measuring the size of a pattern in each of the small regions in the present embodiment will be described in detail.

After acquisition of a scanning electron microscope image, a plurality of arbitrary small regions can be selected by means of the small regions selecting unit 102 in the operation appliance. For the selection, the operator can manually set the size of each of the small regions and the number thereof but plural arbitrary small regions can be designated through a GUI as will be seen from FIGS. 3A and 3B. The plural arbitrary small regions are stored as a two-dimensional digital image in the storage 11. The two-dimensional digital image is called out of the storage medium 11 in step 204 and a pitch between adjacent patterns of a standard specimen in each of the plural small regions is measured with the dimension measurement unit 103.

Figure 4A:
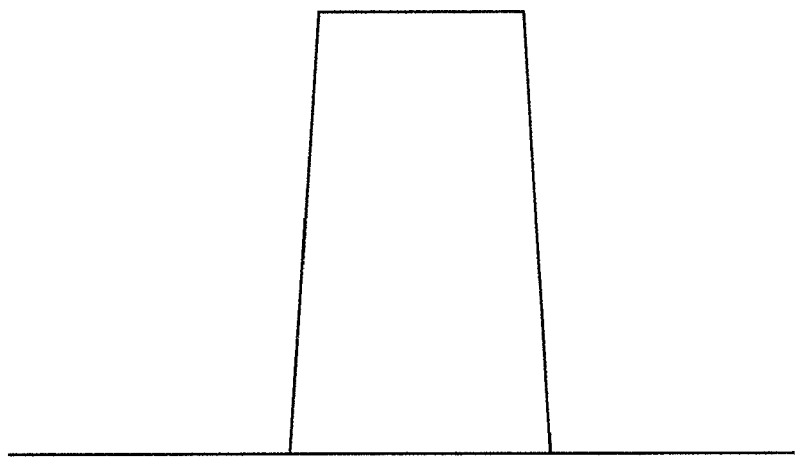
FIGS. 4A and 4B are diagrams showing a sectional view of a pattern of about 100 nm line width and a scanning electron microscope signal, respectively.
Figure 4B:
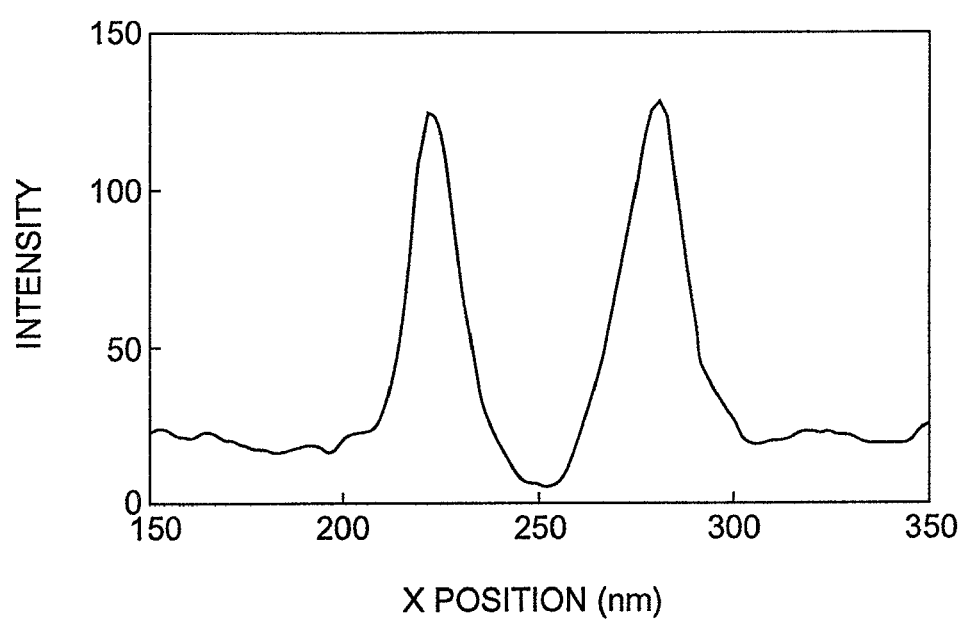

A detailed description will be given of the algorithm of measuring the pattern dimension and pattern pitch with the scanning electron microscope in the steps of measuring the pattern size and pattern pitch. A sectional form of a pattern is illustrated in FIG. 4A and a scanning electron microscope signal obtained when the pattern is observed is illustrated in FIG. 4B. In the scanning electron microscope, the intensity of a secondary electron signal increases at edges of the pattern and this signal maximal portion is called a white band. Conventionally, by taking advantage of this phenomenon, the width between the white bands is measured to perform measurement of the pattern line width or the pattern pitch.

Figure 5A:
FIGS. 5A and 5B are diagrams showing a sectional view of a pattern of about 10 nm line width and a scanning electron microscope signal, respectively.
Figure 5B:
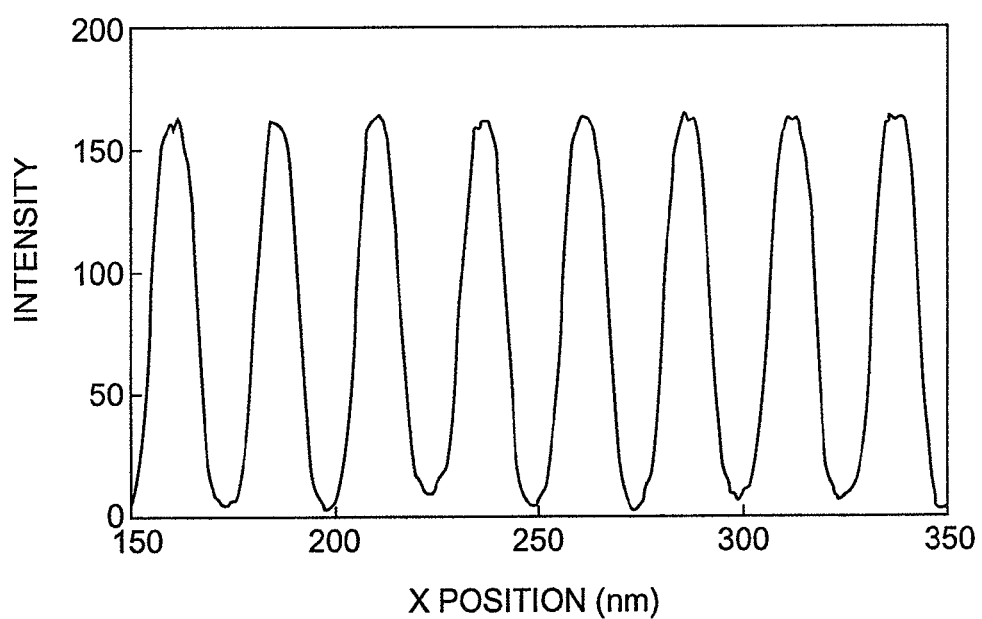

But, as the pattern width decreases as shown in FIG. 5A, the spacing between white bands at opposing edges also decreases and peaks at the two edges overlap to form a substantially single peak as shown in FIG. 5B. Pursuant to the conventional measurement algorithm using the white bands, the reliability of measurement deteriorates in the case of the signal waveform shown in FIG. 5B.

Accordingly, in the present embodiment, not the measurement algorithm using the white bands but an evaluation method adopting FFT (fast Fourier transformation) or a correlation function is employed. With the evaluation method using FFT or correlation coefficients, the repeat period for patterns of or in a standard specimen can be calculated from a signal waveform obtained in a small region and the pattern pitch in the standard specimen can be calculated through frequency analysis, thereby ensuring that accurate measurement can be achieved even in the case of the signal waveform as shown in FIG. 5B.

For example, even when a specimen prepared by selectively etching a section of a multiplayer film having a line width of about 10 nm is used, critical dimensions can be taken even at a high magnification of about 300 k times through the use of the algorithm and the distortion calibration can be accomplished even during taking high magnification critical dimensions.

The pattern pitch in standard specimen calculated on the basis of the FFT or correlation method is an averaged pattern pitch within a small region and is immune to the local roughness of the standard specimen and the noise of the scanning electron microscope as well, so that highly reliable measurement results can be obtained.

Figure 3A:
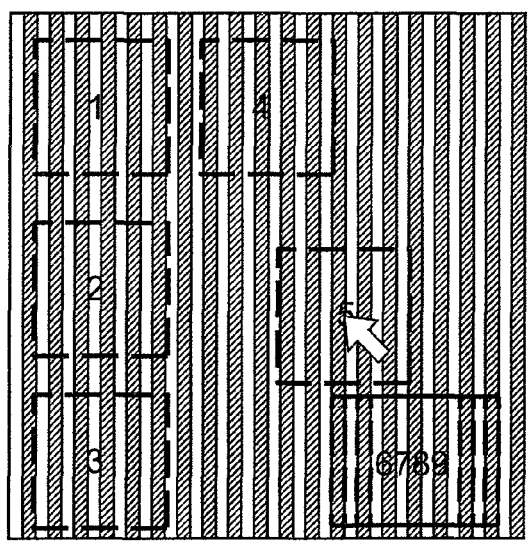
FIGS. 3A and 3B are diagrams showing an example of a GUI used for selecting a plurality of small regions.
Figure 3B:
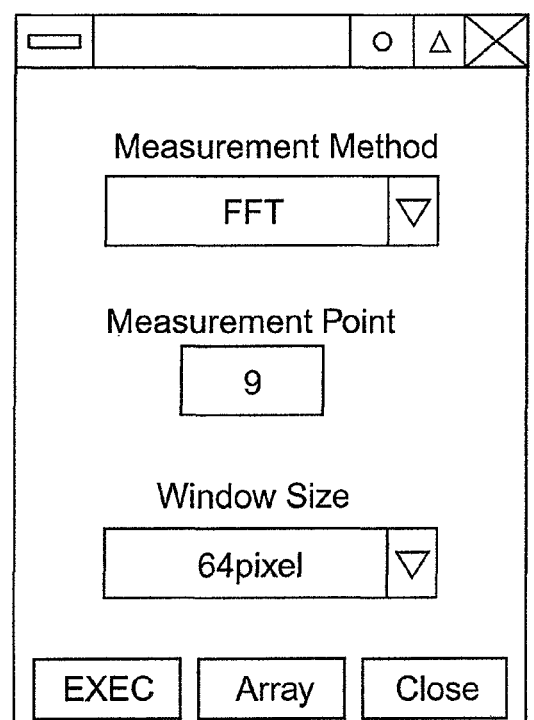

Illustrated in FIGS. 3A and 3B is an instance where the FFT is used as algorithm for measurement (measurement method) of the pattern pitch in a standard specimen and the number of arbitrary small regions (measurement points) is 9 each having a size of 64 pixels (window size). But the parameters as above can be set arbitrarily through the GUI.

Figure 6A:
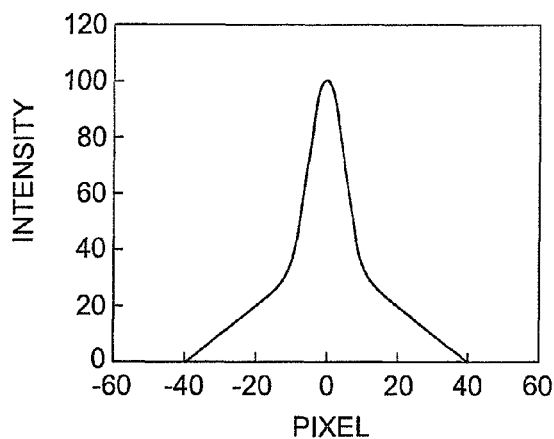
FIGS. 6A to 6C are graphic representations showing how a FFT signal changes with the number of patterns contained in a small region.
Figure 6B:
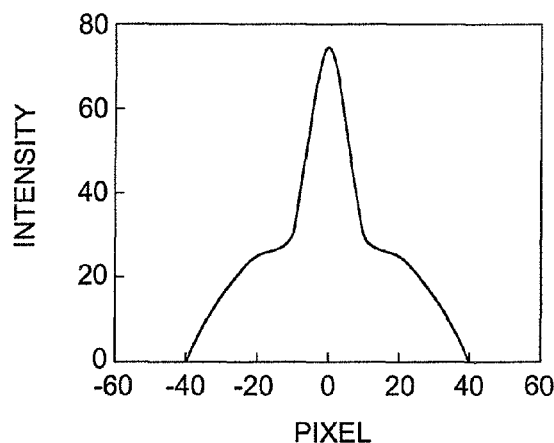
Figure 6C:
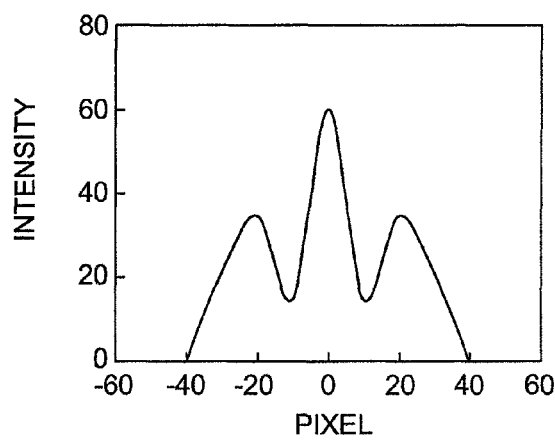

In the present embodiment, at least three or more patterns inside an arbitrary small region are necessary in taking critical dimensions. As shown in FIGS. 6A to 6C, the FFT frequency space signal changes with a parameter represented by the number of patterns in the small region. With only two or less patterns contained, the DC component cannot be separated from the repeat signal and critical dimension of the pattern cannot be taken. With three or more patterns contained, separation between the DC component and the repeat signal is possible and in the present embodiment, it is necessary that at least three or more patterns be contained in a small region. Since at least three or more patterns are necessary for a small region, the distortion measurement/calibration cannot be accomplished with a single pattern standard specimen during high magnification/low magnification measurement. Therefore, for the purpose of calibrating the distortion during both the high magnification and low magnification measurements, a standard specimen having a plurality of line widths or pattern pitches is used. For example, a standard specimen having both a multi-layer film and a grating pattern having 100 nm pitch is usable. But the present embodiment is in no way limited thereto.

Figure 7:
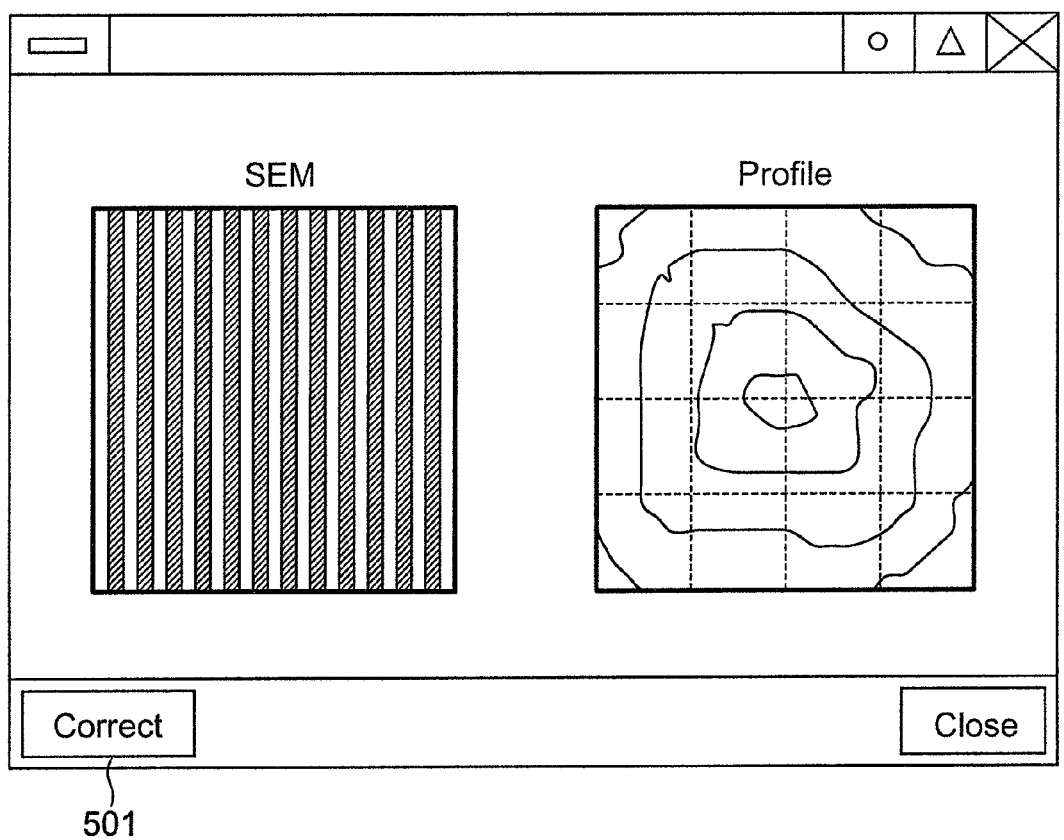
FIG. 7 is a diagram of a GUI showing a scanning electron microscope image and a distortion distribution therein.

From the distribution of results of measurement of pattern pitches carried out within the standard specimen in respect of each of the arbitrary plural small regions, the distribution of distortions in a secondary electron image can be calculated by means of the distortion calculation unit 104. Specifically, the difference between the result of pattern pitch measurement in each small region and the nominal value for the standard specimen may be used to define the distortion distribution or where one of the small regions is used as a reference, the difference between the pattern pitch measurement result in the reference region and that in the remaining small regions may be employed to define the distortion distribution. Then, the thus calculated distortion distributions in the individual small regions may be displayed numerically on the display unit or the two-dimensional distribution of results of the pattern pitch measurements in the individual small regions may be displayed in the form of contour lines as shown in FIG. 7. By displaying the two-dimensional distribution in the contour line form, visible recognition can be facilitated to enable the operator to comprehend the scanning distortion intuitively.

The standard specimen used in the present embodiment has a periodic structure having the pattern pitch known as a nominal value, which periodic structure is uniform in the field of view of the scanning electron microscope and therefore it can be concluded that the two-dimensional distribution of pattern pitch shown in FIG. 7 corresponds to a scanning distortion in the scanning electron microscope.

According to the present embodiment, the highly reliable scanning distortion measurement is possible but for the sake of performing a scanning distortion measurement of further higher reliability to calibrate a scanning distortion, the measurement of scanning distortion distribution based on this method is carried out at different plural locations and distortion distributions are compared with one another to advantage. Through this, the influence the roughness of specimen and the noise of scanning electron microscope have can further be reduced. In this case, the scanning distortion distribution calculated by the distortion calculation unit 104 included in operation appliance 108 is stored in the storage medium 11. Distortion distributions are calculated similarly at a plurality of locations and results of the individual scanning distortion distributions are stored in the storage medium 11. After a predetermined number of scanning distortion distribution calculating operations have ended, the plural scanning distortion distributions stored in the storage medium 11 are averaged by the correction value calculation unit 106 in information processor 108. A correction amount is calculated from an average scanning distortion amount by means of the correction value calculation unit 106 so as to change the deflector signal controlled by the SEM control unit 12, thereby ensuring that the scanning distortion amount calculation of less error can be achieved and a scanning electron microscope image of more reduced scanning distortion can be provided.

Next, the step of calibrating the scanning distortion on the basis of the two-dimensional scanning distortion distribution will be described.

Scanning in the scanning electron microscope is executed in sequence as shown in FIG. 8. In the scanning electron microscope used in the present embodiment, a secondary electron image is formed using 512 scanning lines in the vertical direction. But, the order of scan of the 512 scanning lines is not limited to FIG. 8 and even in the case of any scan sequence, the present embodiment can also be applied. Further, the number of scanning lines is not limited to 512 and even in the case of, for example, 1024 or 256, the present embodiment is also applicable.

Figure 9A:
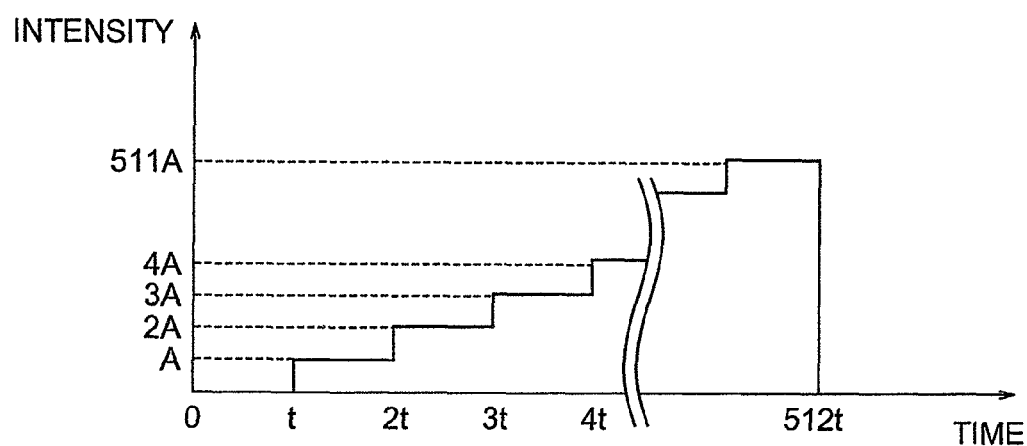
FIGS. 9A and 9B are graphic representations showing deflection signals in the scanning electron microscope.
Figure 9B:
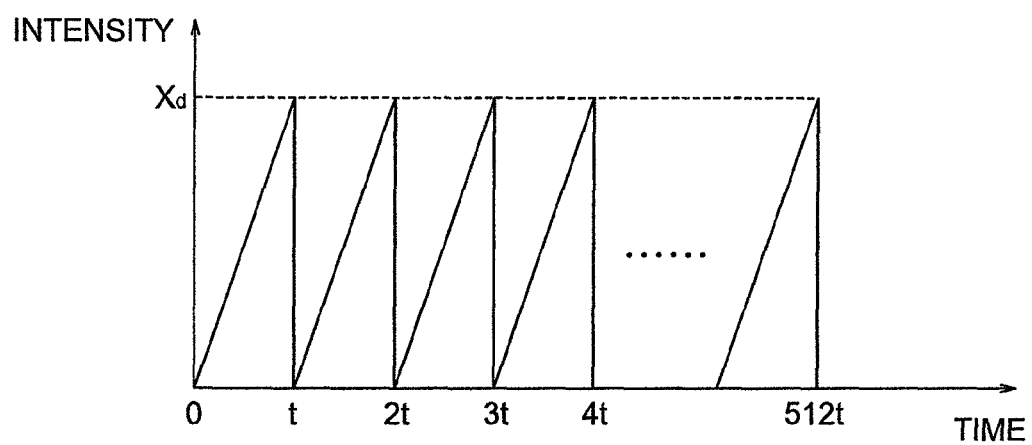

The control signals for ordinary electron beam scan in the scanning electron microscope are illustrated in the form of a schematic waveform in FIGS. 9A and 9B. The scan control signal in X direction takes a saw-tooth form and the position in the X direction during illumination of the electron beam is determined in accordance with the control signal. The scan control signal in Y direction changes stepwise and during an interval that the scan control signal in X direction changes from 0 to $X_d$, the scan control signal in Y direction remains unchanged and during a period for transition of the scan control signal in X direction $X_d$ to 0, the scan control signal in Y direction increases by one step. When the electron microscope image is formed of 512×512 pixels as in the present embodiment, the electron beam is illuminated until change of the scan control signal in Y direction from 0 step to 511 step is completed to capture secondary electron signals and form images, with the result that a secondary electron image of one frame can be obtained.

Figure 10:
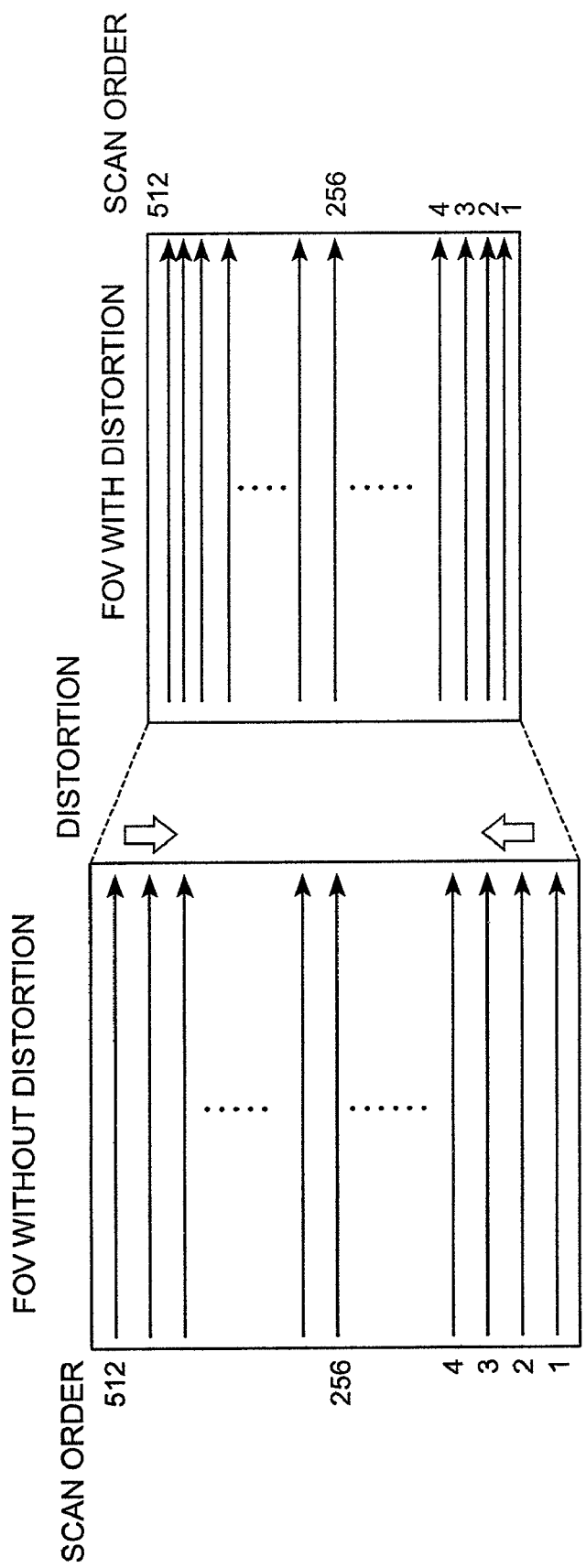
FIG. 10 is a diagram showing the field of view of the scanning electron microscope when distortions occur in Y direction.

In the presence of a scanning distortion, the control signals for electron beam scanning as illustrated in FIGS. 9A and 9B need to be changed. For example, when the scanning distortion in Y direction is observed as shown in FIG. 10, the distortion can be calibrated as will be described below. Referring to FIG. 10, in case the scanning distortion is such that the scanning line interval is narrowed at upper and lower edges of the electron microscope view field but is normal in the central portion, the scanning distortion is calculated by the distortion calculation unit 104 in information processor 108 to provide a result as shown in FIG. 10.

Figure 11A:
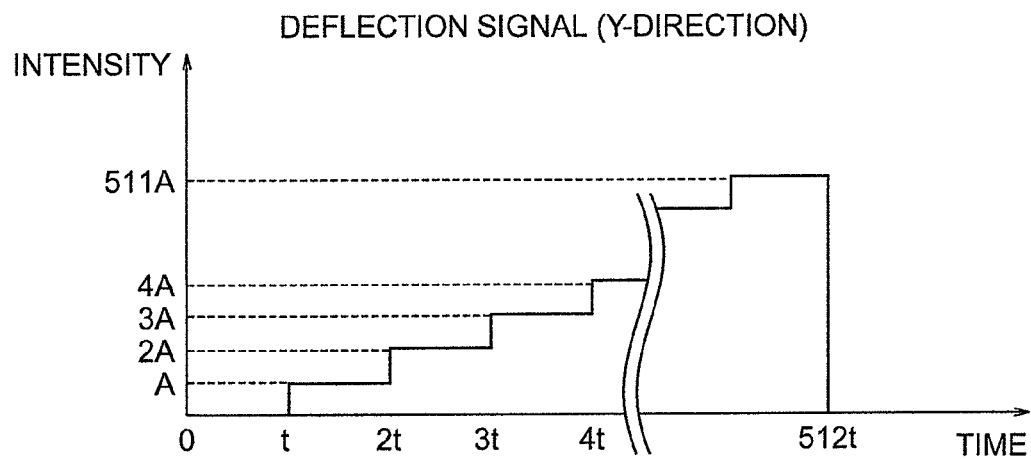
FIG. 11A is a graphic representation showing an ordinary Y-direction control signal.
Figure 11B:
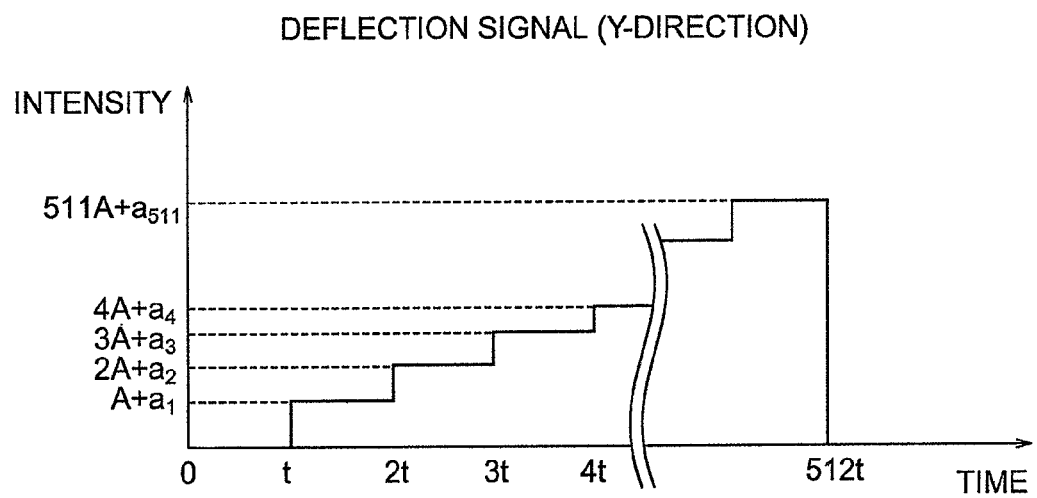
FIG. 11B is a graphic representation showing a deflection signal for calibrating the Y-direction distortions.

In order to calibrate the scanning distortion, the intensity of the control signal applied to the deflector 4 needs to be changed every scanning line and a changed scan control signal in Y direction is illustrated in the form of time chart in FIG. 11B. Illustrated in FIG. 11B is the result of calculation by the correction value calculation unit 106 in information processor 108 and the correction amount indicates that for calibration of the distortion shown in FIG. 10, the scanning line interval needs to be widened at upper and lower edges of the electron microscope view field. Accordingly, a correction signal which renders the level of one step of the scanning control signal in Y direction adjusted as shown in FIG. 11B to make the scanning line interval equidistant may be calculated. By delivering the correction signal as shown in FIG. 11B to the electron optics controller 12 which in turn controls the electron optics 1, a scanning electron microscope of less scanning distortion can be provided.

Figure 12:
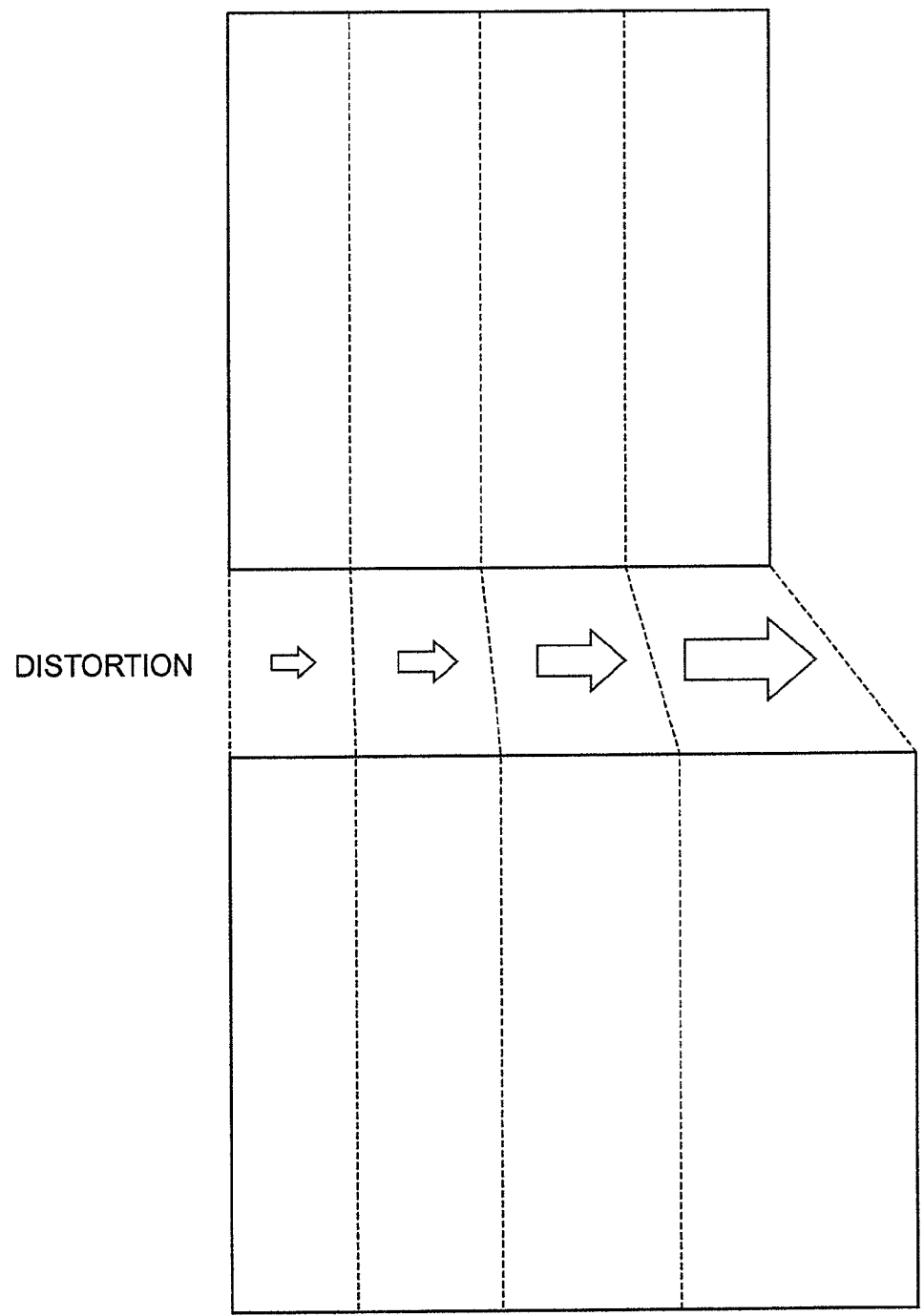
FIG. 12 is a diagram showing the field of view of the scanning electron microscope when distortions occur in X direction.

Next, the distortion calibration to be executed when a scanning distortion in X direction is observed as shown in FIG. 12 will be described. Illustrated in FIG. 12 is such a scanning distortion that the distortion amount is small at the left end of the electron microscope view field but as the scan proceeds in the right direction of electron microscope view field, the distortion amount increases. This scanning distortion is the result of calculation by the distortion calculation unit 104 in information processor 108. In FIG. 12, an arrow mark indicates a direction of distortion and a size of distortion as well.

Figure 13A:
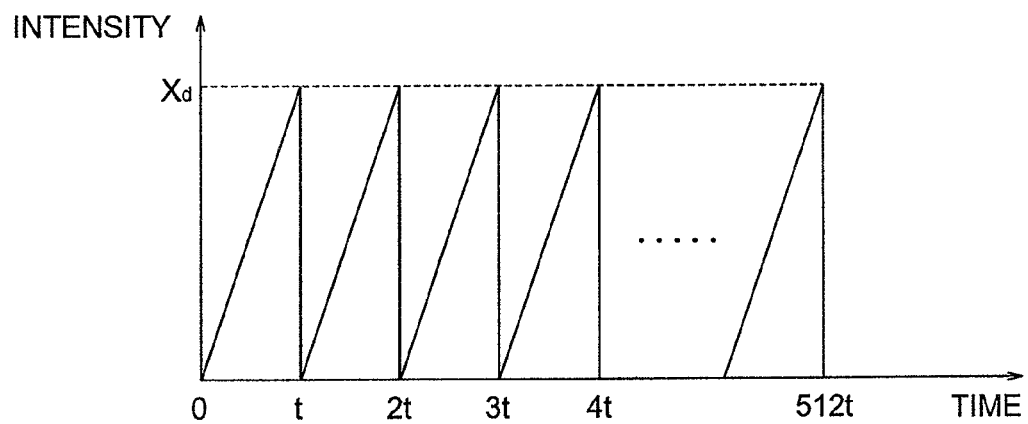
FIG. 13A is a graphic representation showing an ordinary X-direction control signal.
Figure 13B:
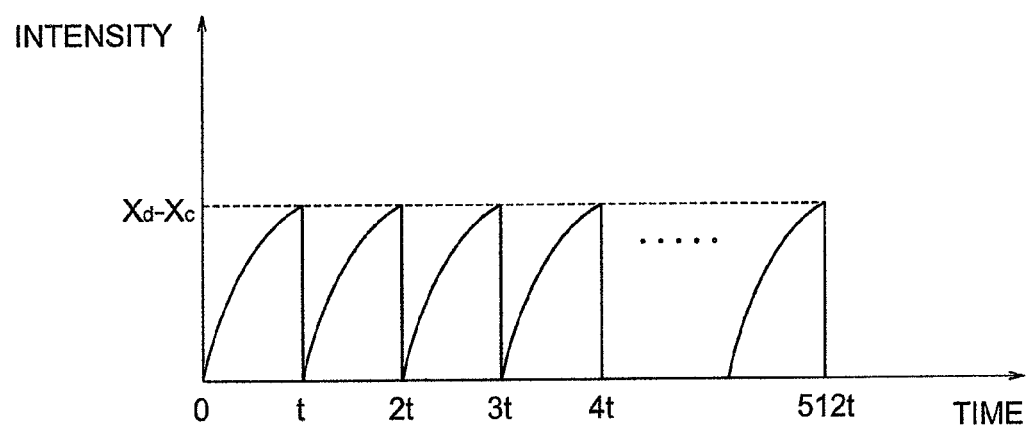
FIG. 13B is a graphic representation showing a deflection signal for calibrating the X-direction distortions.

In order to calibrate the scanning distortion as shown in FIG. 12, a scan control signal in X direction as shown in FIG. 13B needs to be applied to the deflector 4. Illustrated in FIG. 13B is the result of calculation by the correction value calculation unit 106 in information processor 108 and according to the correction amount, for the purpose of correcting the scanning distortion of FIG. 12, the scanning signal intensity is calibrated at intervals of time steps in FIG. 13B. By delivering the scanning signal of FIG. 13B to the SEM control unit 12 to control the electron optics 1, a scanning electron microscope devoid of the distortion in X direction can be provided.

Namely, in the scanning distortion calibration, a correction signal complying with the calculated scanning distortion amount is first calculated by the calculating unit 106 and then a signal to be applied to the deflector is controlled by means of the SEM control unit 12. Through the steps, a scanning electron microscope of less scanning distortion can be provided.

The distortion correction according to the present embodiment ends when "No" is selected in the step 207 in FIG. 2. The selection may be done manually by the operator or alternatively automatically when the distortion amount falls below a level preset in the operation appliance. The preset distortion amount is set in a unit of % or of nm. In case, for automatic execution of the step 207 in FIG. 2, 4×4 small regions as shown in FIG. 7, for example, are selected, "Yes" is selected in the step 207 in FIG. 2 as far as the distortion amount exceeds the preset amount even in one region and the distortion correction is resumed. When the distortion amount falls below the preset amount in all of the 4×4 regions, "No" is automatically selected in the step 207 in FIG. 2. In this instance, the 4×4 regions laid not overlapping each other are exemplified but regions laid overlapping each other in an image may be selected or designated to form small regions in an overlapping fashion.

The above procedure is also effective for a distortion distribution other than the scanning distortion distribution explained in connection with the present embodiment and according to the present invention, highly precise scanning distortion calibration can be achieved.

Embodiment 2

Next, an embodiment will be described in which the signal for controlling the scan function by the deflector is not calibrated but the magnification for scanning electron microscope image is calibrated at a plurality of locations in a scanning electron microscope image.

Figure 14:
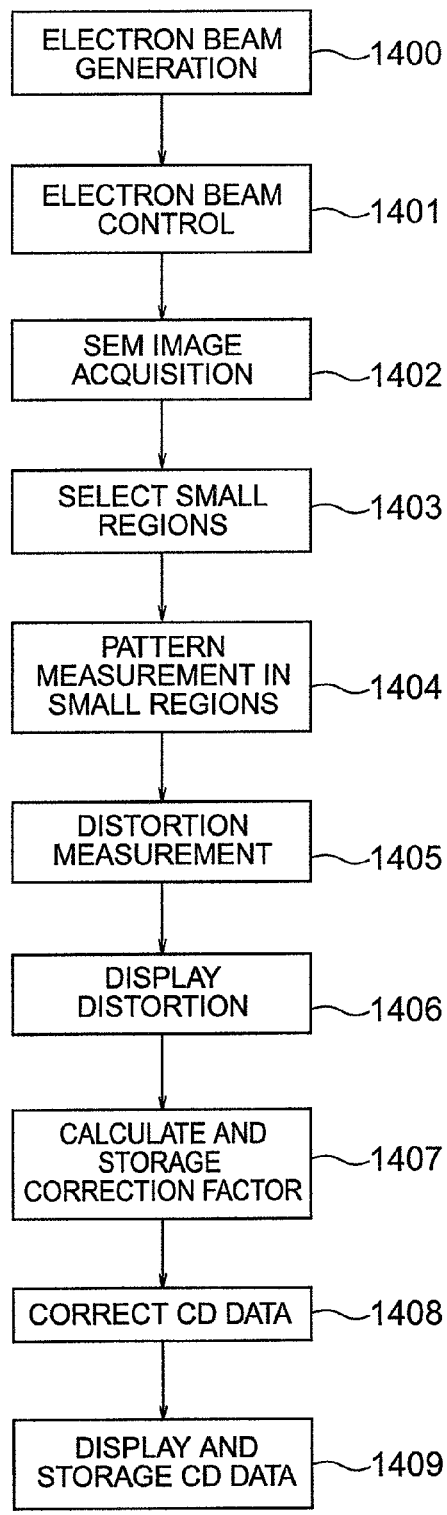
FIG. 14 is an exemplified flowchart of the procedure for calibration of in-plane magnification.

A flow in the case of reflecting the scanning distortion upon the magnification in the course of taking critical dimensions is shown in FIG. 14.

The present embodiment is executed similarly to embodiment 1 until the steps of performing measurement in plural arbitrary small regions, calculating the scanning distortion distribution and displaying the results are completed and therefore, steps 1400 to 1406 will not described herein. In-plane dimension calibration coefficients in the scanning electron microscope are calculated from the scanning distortion amount measurement results by means of the distortion correction value calculation unit 106 included in information processor 108. Similarly, the pixel sizes in the scanning electron microscope image are corrected on the basis of the calibration coefficients in respect of the individual small regions by means of the correction value calculation unit 106, dimension values after the correction are calculated by means of a CD correction unit 107 and the corrected dimension values are displayed on the display device 10. The calibration coefficients are stored, as scanning distortion calibration coefficients at the magnification at which the scanning distortion correction is carried out, in the storage 11.

Figure 15:
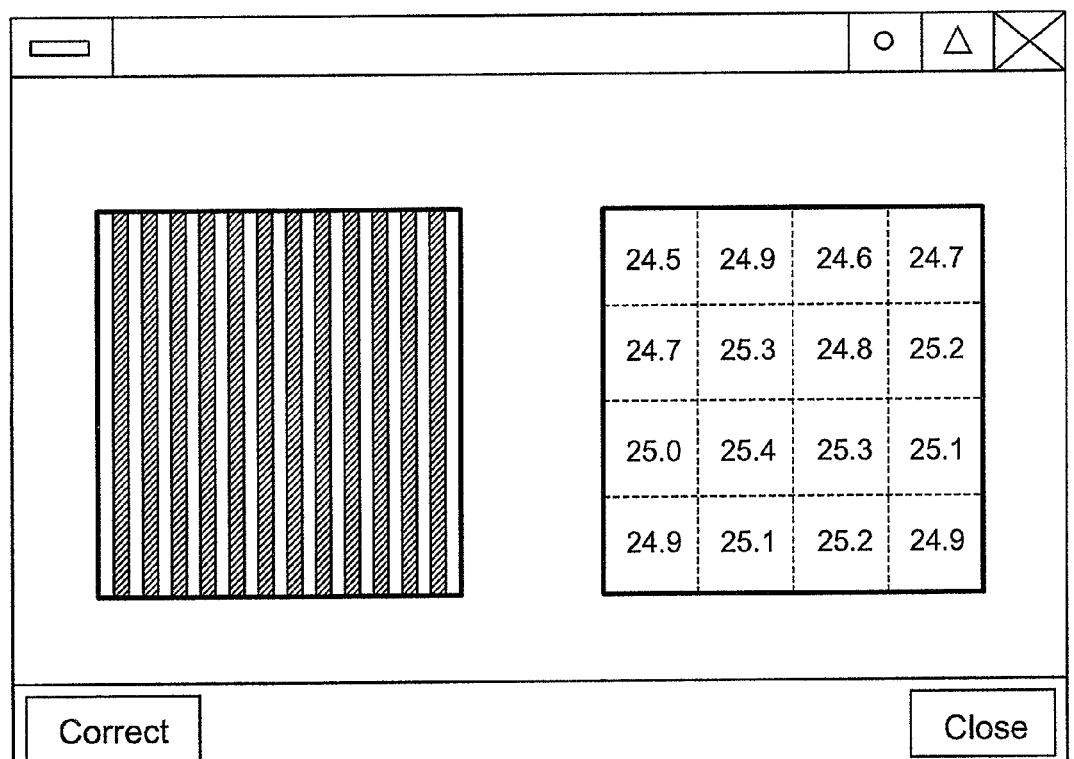
FIG. 15 is a diagram showing a GUI for adjustment of the in-plane magnification.

In the case where the scanning distortion distribution as shown in FIG. 15 is observed, magnification correction will be carried out as described below.

In FIG. 15, an image of 512×512 pixels is divided into 4×4 small regions. From a two-dimensional distribution of pattern pitches in a standard specimen which are measured in respect of each of the small regions by means of the CD correction unit 107, a deflection magnification in each small region is calculated by means of the correction value calculation unit 106. In this example, designation of 4×4 regions laid not overlapping each other is exemplified but regions laid overlapping each other in the image can also be selected or designated as a plurality of small regions. Since, in the present embodiment, the standard specimen is used having a periodic structure in which the line width or pattern pitch is known as a nominal value and particularly having a uniform periodic structure in the view field of the scanning electron microscope, the two-dimensional distribution indicates local magnification errors due to scanning distortion.

Then, the magnification is calibrated for each small region such that the pattern pitch in standard specimen measured in each small region coincides with the nominal value. Specifically, such a magnification as making the pattern pitch measured in each small region identical to the nominal value is calculated by means of the correction value calculation unit 106. A pixel size (nm/pixel) in each small region is independently calculated on the basis of each magnification and the pixel size is stored in the storage medium 11. Upon dimension measurement, the pixel size is read out of the storage medium 11 and a distance between two points to be measured is converted in unit from pixel to nm so that its dimension value may be displayed.

In the present embodiment, the electron beam scan control signal is not calibrated but only the magnification of a scanning electron microscope image, that is, the pixel size is changed in respect of the individual small regions and hence the scanning electron microscope image is not reacquired, providing a method which is more convenient as compared to (embodiment 1).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
   an electron optics for scanning an electron beam on a predetermined region of a standard specimen whose pattern dimension or pattern pitch is known as a nominal value;
   detection means for detecting secondary electrons or backscattering electrons generated under the scan of the electron beam; and
   operation means for calculating a pattern dimension or pattern pitch in said predetermined region, wherein
   said operation means includes means for forming an image from information of secondary electrons or backscattering electrons detected by said detector, means for forming a plurality of regions from said image, means for measuring a pattern dimension or pattern pitch in each of said plurality of formed regions, and means for calculating a scanning distortion amount of said electron beam to calculate a difference between the nominal value and the distribution of the pattern dimension or pattern pitch.

2. A scanning electron microscope according to claim 1 further comprising means for displaying said distribution of pattern dimension or pattern pitch.

3. A scanning electron microscope according to claim 1, wherein said electron optics includes a deflector for deflecting said electron beam and controls a signal to said deflector in accordance with the calculated scanning distortion amount.

4. A scanning electron microscope according to claim 1, wherein the in-plane magnification for the image is adjusted such that the pattern dimension or pattern pitch is made to be constant in accordance with the calculated scanning distortion amount.

5. A scanning electron microscope according to claim 1, wherein
the scanning distortion amount of said electron beam is calculated at a plurality of different positions on said standard specimen.

6. A scanning electron microscope according to claim 1, wherein measurement of the pattern dimension or pattern pitch in said region is carried out using FFT or a correlation function.

7. A scanning electron microscope according to claim 1, wherein said standard specimen has mutually different pattern line widths or mutually differently spaced pattern pitches.

8. A scanning electron microscope according to claim 1, wherein at least three or more patterns are included in said region.

9. A measurement method based on a scanning electron microscope comprising the steps of:
irradiating an electron beam on a predetermined illumination region of a specimen whose pattern dimension or pattern pitch is known as a nominal value to acquire an image;
selecting a plurality of arbitrary regions in said acquired image;
measuring pattern dimension or pattern pitch in each of the selected regions;
displaying distribution of the measured pattern dimensions or pattern pitches; and
calculating a scanning distortion amount of said scanning electron microscope to calculate a difference between the nominal value and the distribution of pattern dimensions or pattern pitches.

* * * * *